(12) United States Patent
Lee

(10) Patent No.: US 9,728,513 B2
(45) Date of Patent: Aug. 8, 2017

(54) SEMICONDUCTOR DEVICE AND METHOD FOR MANUFACTURING THE SAME

(71) Applicant: SK hynix Inc., Icheon-si (KR)

(72) Inventor: Yu Jin Lee, Icheon-si (KR)

(73) Assignee: SK HYNIK INC., Icheon (KR)

( * ) Notice: Subject to any disclaimer, the term of this patent is extended or adjusted under 35 U.S.C. 154(b) by 444 days.

(21) Appl. No.: 13/687,250

(22) Filed: Nov. 28, 2012

(65) Prior Publication Data
US 2013/0320489 A1    Dec. 5, 2013

(30) Foreign Application Priority Data
May 30, 2012    (KR) .................. 10-2012-0057430

(51) Int. Cl.
H01L 23/62    (2006.01)
H01L 21/56    (2006.01)
H01L 23/525    (2006.01)
H01L 23/00    (2006.01)

(52) U.S. Cl.
CPC .............. *H01L 23/62* (2013.01); *H01L 21/56* (2013.01); *H01L 23/5258* (2013.01); *H01L 23/564* (2013.01); *H01L 2924/0002* (2013.01)

(58) Field of Classification Search
CPC . H01L 23/5256; H01L 2924/00; H01L 23/62; H01L 2924/0002; H01L 21/56; H01L 23/5252; H01L 27/11206

USPC .......................................................... 257/529
See application file for complete search history.

(56) References Cited

U.S. PATENT DOCUMENTS

| | | | | |
|---|---|---|---|---|
| 5,519,658 A | * | 5/1996 | Uda et al. ...................... 365/200 |
| 2005/0148113 A1 | * | 7/2005 | Karnezos ...................... 438/109 |
| 2005/0161766 A1 | * | 7/2005 | Sato .................... H01L 23/3192 |
| | | | | 257/529 |
| 2006/0118904 A1 | * | 6/2006 | Liaw ................... H01L 23/5258 |
| | | | | 257/529 |
| 2010/0307797 A1 | * | 12/2010 | Watanabe ............ H05K 1/0281 |
| | | | | 174/254 |

OTHER PUBLICATIONS

"Memory LSI Reliability", by IEEE, vol. 81, No. 5, May 1993.*

* cited by examiner

*Primary Examiner* — Eva Y Montalvo
*Assistant Examiner* — Nga Doan

(57) ABSTRACT

A semiconductor device includes a fuse pattern disposed over a semiconductor substrate, an epoxy mold compound (EMC) layer disposed over the fuse pattern, a first package substrate disposed over the EMC layer, an insulating film disposed over the first package substrate, and a second package substrate disposed over the insulating film. To the first package substrate, a Vss voltage or a negative voltage lower than the Vss voltage is applied to prevent impurities from migrating to the fuse pattern.

7 Claims, 1 Drawing Sheet

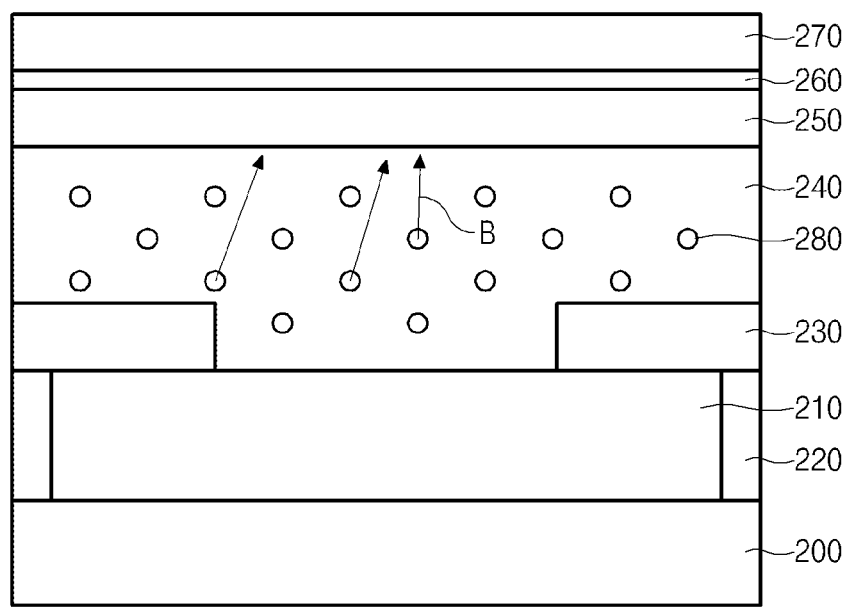

SEMICONDUCTOR DEVICE AND METHOD FOR MANUFACTURING THE SAME

CROSS-REFERENCE TO RELATED APPLICATION

The present application claims priority to Korean patent application No. 10-2012-0057430 filed on May 30, 2012, which is incorporated by reference in its entirety.

BACKGROUND OF THE INVENTION

1. Technical Field

The present invention relates generally to a semiconductor device and a method for manufacturing the same, and more particularly to a semiconductor device and method of manufacturing the same that reduces movement of impurities to fuse patterns to prevent degradation of the semiconductor device.

2. Related Art

A semiconductor device such as a memory device includes a plurality of memory cells for storing data. Even when one memory cell in a memory array of a semiconductor device has a defect caused by a manufacturing process of the semiconductor device, the device is not able to serve as a memory since the whole device becomes defective. However, if the whole memory device is discarded when it is determined that it contains a defective memory cell, it significantly lowers a manufacturing yield.

In order to improve the production yield of a semiconductor device, a repair method is necessary. In the conventional art, a repair method is performed by replacing the defective memory cell with a redundancy memory cell. In a repair method that uses a redundancy cell, a spare row and a spare column are positioned in each cell array. Thus, a defective memory cell can be substituted with a redundancy memory cell in a row/column unit.

Specifically, through a test after wafer processing is finished, a defective memory cell is selected, and a program is performed to replace its corresponding address with an address signal of a spare cell. As a result, when the address signal corresponding to a defective line is inputted, a redundancy line is selected.

Another widely used method is to blow a fuse with a laser beam, thereby performing cell substitution. For this operation, a general memory device has a fuse unit configured to substitute an existing address path with a new address path by blowing the fuse coupled to a defective cell using a laser. A wire, designed to be disconnected by laser irradiation, is referred to as a fuse line, and the disconnection site and its surrounding region are referred to as a fuse box. A semiconductor chip including the fuse box having a fuse obtained in the above-mentioned way is molded by an epoxy mold compound (EMC), and a subsequent process is performed to manufacture a semiconductor package. Impurities may form in components of the semiconductor device near the fuse. Such impurities may result from various processes, including, for example, semiconductor manufacturing processes, packaging processes, and fuse blowing or other repair processes.

BRIEF SUMMARY OF THE INVENTION

Various embodiments of the present invention are directed to reducing movement of impurities to a fuse pattern, thereby preventing degradation of properties of the semiconductor device.

According to one aspect of an exemplary embodiment, a semiconductor device comprises: a fuse pattern disposed over a semiconductor substrate; an epoxy mold compound (EMC) layer disposed over the fuse pattern; a first package substrate disposed over the EMC layer; an insulating film disposed over the first package substrate; and a second package substrate disposed over the insulating film.

The first package substrate and the second package substrate are each may be include copper.

The fuse pattern may be include copper.

The fuse pattern may be coupled to a metal contact, the metal contact penetrating an interlayer insulating film formed over the semiconductor substrate and coupled to the semiconductor substrate.

According to another aspect of an embodiment of the present invention, a method for manufacturing a semiconductor device comprises: forming a fuse pattern over a semiconductor substrate; forming an EMC layer over the fuse pattern; forming a first package substrate over the EMC layer; forming an insulating film over the first package substrate; and forming a second package substrate over the insulating film.

Before forming the fuse pattern, further comprising: forming an interlayer insulating film over the semiconductor substrate; and forming a metal contact penetrating the interlayer insulating film and coupled to the fuse pattern.

The fuse pattern may be formed with a material including copper.

The first package substrate and the second package substrate may be include copper.

After forming the second package substrate, the method further may be comprise applying a Vss voltage or a negative voltage lower than the Vss voltage to the first package substrate.

The first package substrate may be a conductive layer.

The fuse pattern may be configured to receive a first voltage, the first package substrate may be configured to receive a second voltage, the second package substrate is configured to receive a third voltage, the second voltage is lower than the first and the third voltage.

The second voltage may be a Vss voltage or a negative voltage lower than a Vss voltage.

The first voltage may be equal to the third voltage.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 1 illustrates a cross-sectional view of a semiconductor device and a method for manufacturing the same according to an embodiment of the present invention.

DESCRIPTION OF EMBODIMENTS

Embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments of the present invention should not be construed as being limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements.

FIG. 1 illustrates a cross-sectional view of a semiconductor device and a method for manufacturing the same according to an embodiment of the present invention.

Referring to FIG. 1, the semiconductor device according to an embodiment of the present invention is described as follows.

The semiconductor device includes an interlayer insulating film 210 disposed over a semiconductor substrate 200, a metal contact 220 disposed in the interlayer insulating film 210, a fuse pattern 230 coupled to the metal contact 220 and disposed over the interlayer insulating film 210, an epoxy mold compound (EMC) layer 240 disposed over the fuse pattern 230 and the interlayer insulating film 210, a first package substrate 250 disposed over the EMC layer 240, and an insulating film 260 and a second package substrate 270 disposed over the first package substrate 250.

The fuse pattern 230 shown in FIG. 1 is a pattern that results after a fuse cutting process is performed. The fuse pattern 230 may be formed of a metal material, for example, copper. The first package substrate 250 and the second package substrate 270 may be formed of a metal material, including, for example, copper. The insulating film 260 prevents an electric short between the first package substrate 250 and the second package substrate 270.

A Vss voltage or a negative voltage lower than the Vss voltage is applied to the first package substrate 250 so as to prevent metal ions generated in the second package substrate 270 from moving towards the EMC layer 240. Thus, the amount of metal ions in the EMC layer 240 can be reduced. Moreover, impurities that may be present in the EMC layer 240 move towards the first package substrate 250 so that the impurities in the EMC layer may be further reduced. As a result, migration of impurities to the fuse pattern 230 can be reduced. The impurities 280 may include bismuth ions (Bi+3).

Referring to FIG. 1, a method for manufacturing a semiconductor device according to an embodiment of the present invention is described as follows.

The interlayer insulating film 210 is formed over the semiconductor substrate 200 including lower structures. After the interlayer insulating film 210 is etched to form a contact hole, a metal material is buried in the contact hole to obtain a metal contact 220. The fuse pattern 230 is formed over the interlayer insulating film 210 so as to be coupled to the metal contact 220. The fuse pattern 230 is formed of a metal material, for example, copper. A fuse pattern 230 (shown in FIG. 1) is configured to be cut, for example, by a blowing process.

A package process is performed to form an EMC layer 240 over the overall upper portion including the fuse pattern 230 and the interlayer insulating film 210. The semiconductor package process is performed to protect the semiconductor chip from the outside, facilitate electric connection with external terminals and electric apparatus, and secure the reliability of the semiconductor chip.

The first package substrate 250 is formed over the EMC layer 240. The insulating film 260 is formed over the first package substrate 250, and the second package substrate 270 is formed over the insulating film 260. The first package substrate 250 and the second package substrate 270 may be formed of a metal material, for example, copper. The insulating film 260 prevents an electric short between the first package substrate 250 and the second package substrate 270.

A Vss voltage or a negative voltage lower than the Vss voltage is applied to the first package substrate 250, which prevents movement of metal ions or impurities towards the EMC layer 240 from the second package substrate 270. Thus, the metal ions present in the EMC layer 240 are reduced. Reducing the amount of metal ions or impurities present in the EMC layer 240 provides an effect of preventing migration of the metal ions or impurities to fuse pattern 230, for example, after the fuse is cut or blown. A Vdd voltage is applied to the second package substrate 270, the Vss voltage is lower than the Vdd voltage. A voltage that is applied the fuse pattern 230 is equal to the voltage that is applied the second package substrate 270.

Moreover, the impurities 280, which may for example, be generated from the package process, are moved towards the first package substrate 250 (along the B direction) to prevent the impurities 280 that remain in the EMC layer 240 from migrating to the fuse pattern 230. The impurities 280 may include bismuth ions (Bi+3).

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a fuse pattern disposed over a semiconductor substrate and configured to receive a first voltage;
   an epoxy mold compound (EMC) layer disposed over the fuse pattern;
   a first package substrate disposed over the EMC layer and configured to receive a second voltage;
   an insulating film disposed over a surface of the first package substrate; and
   a second package substrate disposed over a surface of the insulating film and configured to receive a third voltage, wherein the second voltage is lower than the first voltage and the third voltage, and wherein the insulating film directly contacts the first package substrate and the second package substrate, and the EMC layer comprises impurities including bismuth ions ($Bi^{+3}$), wherein impurities in the EMC layer migrate towards the first package substrate when the first, second and third voltages are applied.

2. The semiconductor device according to claim 1, wherein the first package substrate and the second package substrate each include copper.

3. The semiconductor device according to claim 1, wherein the fuse pattern includes copper.

4. The semiconductor device according to claim 1, wherein the fuse pattern is coupled to a metal contact, the metal contact penetrating an interlayer insulating film formed over the semiconductor substrate and coupled to the semiconductor substrate.

5. The semiconductor device of claim 1, wherein the first package substrate is a conductive layer.

6. The semiconductor device of claim 1, wherein the first voltage is equal to the third voltage.

7. The semiconductor device of claim 1, wherein the second voltage prevents impurities from migrating towards the fuse pattern.

* * * * *